(12) United States Patent
Dobyns et al.

(10) Patent No.: US 7,545,377 B2
(45) Date of Patent: Jun. 9, 2009

(54) METHOD AND APPARATUS FOR DIGITIZED WAVEFORM DISPLAY

(75) Inventors: Kenneth P. Dobyns, Beaverton, OR (US); Paul M. Gerlach, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/442,502

(22) Filed: May 25, 2006

(65) Prior Publication Data

US 2007/0273694 A1    Nov. 29, 2007

(51) Int. Cl.
*G06T 11/20* (2006.01)
(52) U.S. Cl. .................... 345/440.1; 345/440
(58) Field of Classification Search .............. 345/440, 345/440.1; 702/68, 72
See application file for complete search history.

(56) References Cited

U.S. PATENT DOCUMENTS

| 4,253,152 | A | * | 2/1981 | Holdaway | 345/440 |
| 5,517,105 | A | * | 5/1996 | Holzwarth | 345/667 |
| 5,617,523 | A | * | 4/1997 | Imazu et al. | 345/440 |
| 6,201,384 | B1 | * | 3/2001 | Alexander | 345/440.1 |
| 6,559,686 | B1 | * | 5/2003 | Alexander et al. | 345/440.1 |
| 6,917,889 | B2 | * | 7/2005 | Ward et al. | 702/67 |
| 7,227,549 | B2 | * | 6/2007 | Beasley et al. | 345/440.1 |
| 2002/0062199 | A1 | * | 5/2002 | Pickerd et al. | 702/72 |
| 2002/0063712 | A1 | * | 5/2002 | Ilic | 345/440 |

OTHER PUBLICATIONS

"SignalExplorer", Yokogawa Electric Corporation, 2000, p. 1-8.*

* cited by examiner

*Primary Examiner*—Chante Harrison
(74) *Attorney, Agent, or Firm*—Derek Meeker; Thomas F. Lenihan

(57) ABSTRACT

An apparatus for displaying a digitized waveform includes an overview display configured to display a digitized waveform scrolling across the overview display, a zoom display configured to display a portion of the digitized waveform, and a control unit configured to cause the portion of the digitized waveform displayed in the zoom display to track the displayed portion of the digitized waveform in response to a track signal.

11 Claims, 7 Drawing Sheets

METHOD AND APPARATUS FOR DIGITIZED WAVEFORM DISPLAY

FIELD OF THE INVENTION

This invention relates to test and measurement instruments and, more particularly, to test and measurement instruments displaying digitized waveforms.

BACKGROUND OF THE INVENTION

A digital oscilloscope may include a roll mode. In the roll mode, waveform data is added to the right hand edge of the screen as it becomes available. Existing data is shifted to the left as this new data is drawn. As a result, the user is able to capture all of the activity associated with a signal with a reduced possibility of missing information.

The data displayed in the roll mode moves across the screen at a rate in time related to the acquisition rate. Specifically, the refresh rate of the display screen (typically 30 Hz) controls when the waveform will be moved across the screen, and the acquisition rate determines how far across the screen the waveform will be moved. However, because of the large amount of data displayed on a screen and the limited resolution of a screen, events occurring over a short period of time may not be visible. To examine a waveform in greater detail, a user may wish to zoom in on such small events.

However, because of the large amounts of data involved and the relatively slow speed of converting the data into a displayable image, roll mode has typically been implemented without the benefit of a zoom feature. Even if a zoom feature is implemented, the zoom display operates in roll mode with the same number of samples appearing in the zoom display as the main display. Since the zoom display displays the waveform with a smaller time base, and the data is appearing at the same rate in both displays, the waveform appears to be moving through the zoom display at a faster rate. In fact, as the magnification of the zoom display is increased, the rate at which the data appears to move through the zoom display is increased. Thus, an event occurring over a short time period would only be visible in the zoom display for a short amount of time.

Accordingly, there remains a need for an improved apparatus and method for displaying digitized waveforms.

SUMMARY OF THE INVENTION

An aspect of the invention includes apparatus for displaying a digitized waveform including an overview display configured to display a digitized waveform scrolling across the overview display, a zoom display configured to display a portion of the digitized waveform, and a control unit configured to cause the portion of the digitized waveform displayed in the zoom display to track the displayed portion of the digitized waveform in response to a track signal.

Another aspect of the invention includes a method for displaying a digitized waveform on a test and measurement instrument. The method includes displaying a digitized waveform scrolling over time, displaying a portion of the digitized waveform scrolling over time in a zoom display such that new samples of the digitized waveform appear in the displayed portion of the digitized waveform at the same rate as the new samples of the digitized waveform appear in the displayed digitized waveform, receiving a control signal, and maintaining the display of the portion of the digitized waveform displayed in the zoom display as it was at substantially the same time as the control signal was received while the new samples of the digitized waveform continue to appear in the displayed digitized waveform.

The foregoing and other aspects of the invention, and advantages thereof, will become more readily apparent from the following detailed description and accompanying drawings.

DETAILED DESCRIPTION OF THE DRAWING

As described above, some waveform displays make it difficult for a user to observe events, such as short-lived transient events. In particular, when viewing a digitized waveform in roll mode, transient events may be difficult if not impossible to discern on a display. Even if a display with sufficient magnification to see a transient event is used, the waveform may move too quickly through the display for a user to sufficiently analyze the transient event. A zoom display that can track a portion of the digitized waveform may alleviate these difficulties.

Figure 1:
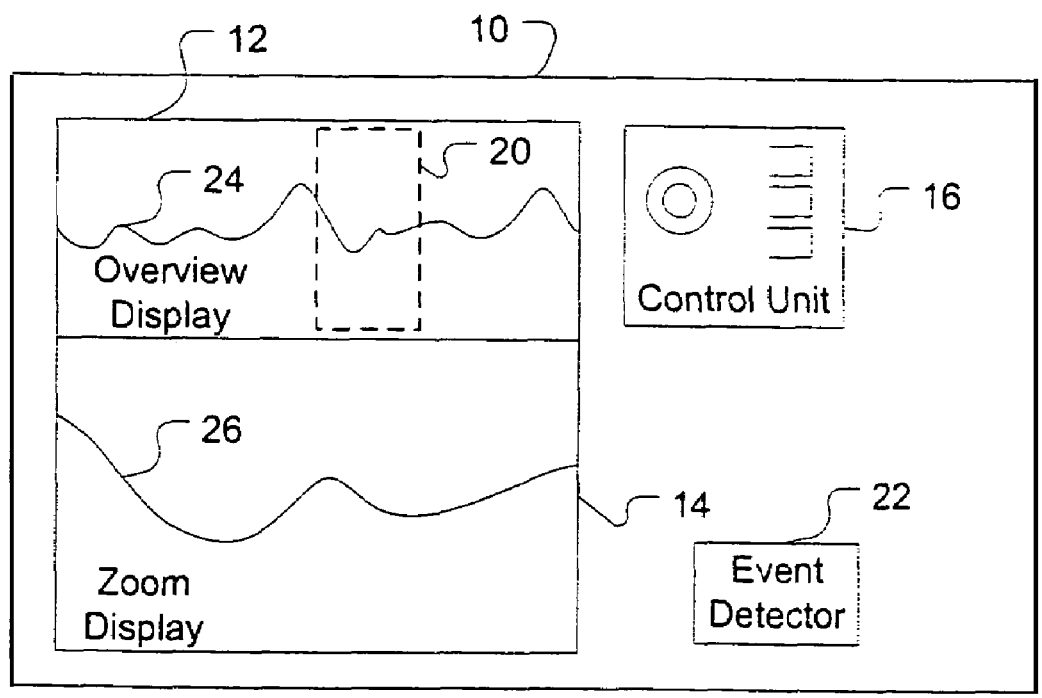
FIG. 1 is a diagram of an apparatus for displaying a digitized waveform according to an embodiment of the invention.

FIG. 1 is a diagram of an embodiment of an apparatus for displaying a digitized waveform. The apparatus 10 includes an overview display 12, a zoom display 14, and a control unit 16. The overview display 12 is configured to display a digitized waveform scrolling across the overview display 12. An example of a waveform scrolling across the overview display is a waveform displayed in roll mode. As new samples of the waveform are acquired, the new samples are added to one edge of the overview display 12. Older samples at an opposite edge of the overview display 12 are removed. Thus, the digitized waveform appears to be scrolling across the overview display 12.

Another example of a digitized waveform scrolling across the overview display 12 is digitized waveform displayed in a playback mode. In playback mode, samples of a previously-acquired and stored waveform are displayed in sequence. Similar to roll mode, current samples are added to one edge of the overview display 12 and older samples are removed from another edge. Thus, the digitized waveform presented in a playback mode may be referred to as a digitized waveform scrolling across the overview display 12.

Although scrolling across a display has been described above as moving from one edge to another, as used in this discussion, scrolling across a display includes displaying a waveform moving substantially along a path on the display. In the roll mode described above, the path may be a line from one edge of a display to an opposite edge of the display. However, the path is not limited to a straight line. For example, data may be displayed in polar coordinates. New data may be drawn offset from the past data by an angular offset. Thus, the data would appear to be moving along a circular path with a center at the center of the polar coordinate system.

The zoom display 14 is configured to display a portion of the digitized waveform.

As described above, the digitized waveform may be scrolling across the overview display 12. Similarly, a portion of the digitized waveform may be scrolling across the zoom display 14. Initially, the zoom display 14 may be fixed in position relative to the overview display 12. Since the digitized waveform is scrolling across the overview display 12, the digitized waveform or, more particularly, a portion of the digitized waveform, will be scrolling across the zoom display 14. If the portion of the digitized waveform displayed in the zoom display 14 is smaller than the entire digitized waveform, the portion of the digitized waveform may appear to be moving faster through the zoom display 14 as compared to the overview display 12. Although the digitized waveform may pass out of the zoom display 14, the data of the digitized waveform is still available as a part of the overview display 12.

The control unit 16 is configured to cause the portion of the digitized waveform displayed in the zoom display 14 to track the displayed portion of the digitized waveform in response to a track signal. To track the displayed portion of the digitized waveform, the zoom display 14 tracks the sample data of the digitized waveform, instead of being locked to a position relative to the overview display 12. This tracking has the effect of "freezing" the zoom display since the same samples are displayed in the zoom display 14 as time passes. However, when the zoom display 12 is tracking the portion of the digitized waveform, a user is provided with the opportunity to study the portion of the digitized waveform in detail.

When the zoom display 14 tracks a particular portion of the digitized waveform, the appearance of the zoom display 14 is similar to merely stopping acquisition. However, acquisition is not stopped so no data is lost while the user observes the portion of the waveform in the zoom display 14. Furthermore, the overview display 12 continues to display the newly acquired data.

The track signal may be generated in response to any number of conditions. An example of a condition that may generate the track signal is a user pressing a "lock zoom display to digitized waveform" button. When the track signal is received, there is a set of samples of the digitized waveform displayed in the zoom display 14. The control unit 16 causes the zoom display to track that set of samples.

The control unit 16 may include a user interface configured to generate the track signal in response to a user input. The user interface may include a "lock zoom display to digitized waveform" button. The button may be a physical button, a soft menu button on a display of the apparatus 10, a button on a remote control, or the like. In response to the user's input, in this case, the user pressing the button, the control unit 16 generates the track signal.

Although a button has been described as a user interface, any number of other types of interfaces may be used. For example, the user interface may include a network interface to receive the user input through a network. Alternatively, the user interface may include a receptacle to connect expansion modules to the apparatus 10, through which the apparatus receives user inputs. Thus, any type of user interface desired may be used, even if the apparatus 10 was not manufactured with that interface.

Although the overview display 12 and the zoom display 14 have been described separately, the overview display 12 and the zoom display 14 may be portions of the same display. Furthermore, the overview display 12 and the zoom display 14 may each be a display that is not currently visible on the apparatus 10. For example, the overview display may 12 be displayed in the background. The zoom display 14 may be displayed in the foreground, completely obscuring the overview display 12.

The overview display 12 may include a zoom indicator 20. The zoom indicator 20 indicates the portion of the digitized waveform displayed in the zoom display 14. Initially, since the zoom display 14 may be locked to a position relative to the overview display 12, the zoom indicator 20 may be fixed in position relative to the overview display 12. After the track signal is received, the apparatus 10 begins to track the portion of the digitized waveform associated with the track signal. The zoom indicator 20 tracks the portion of the digitized waveform displayed in the zoom display 14. Thus, the user has an indication of what portion of the digitized waveform the zoom display 14 is displaying.

Figure 2:
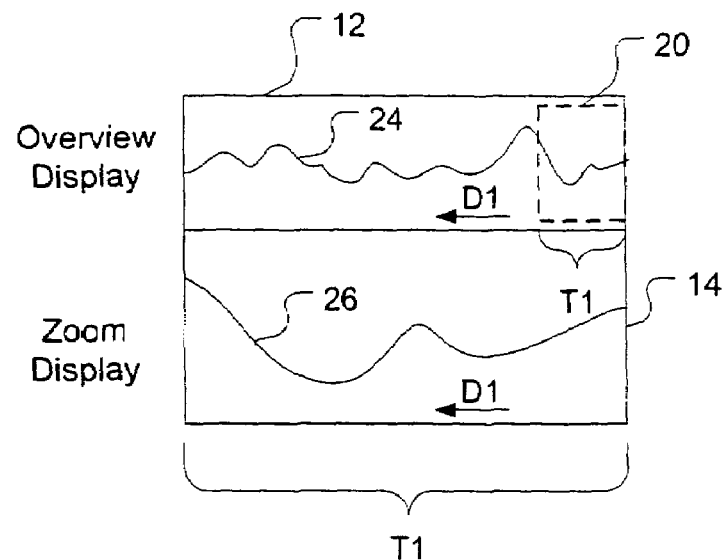
FIGS. 2-4 are diagrams illustrating scrolling of a digitized waveform according to an embodiment of the invention.
Figure 3:
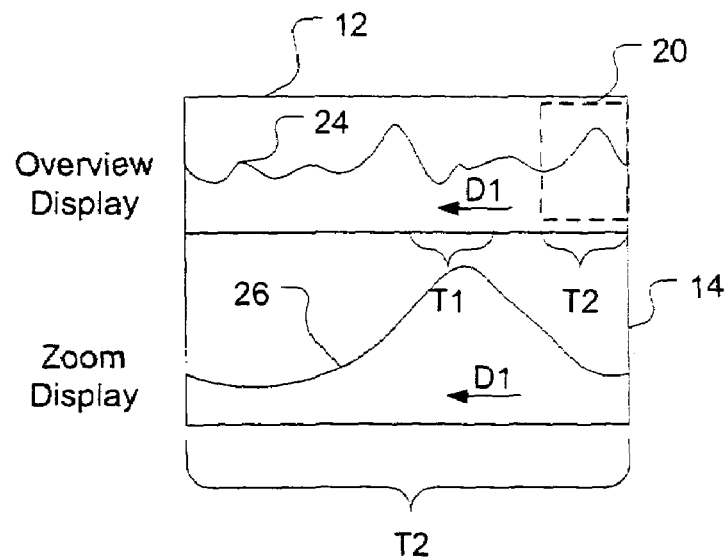
Figure 4:
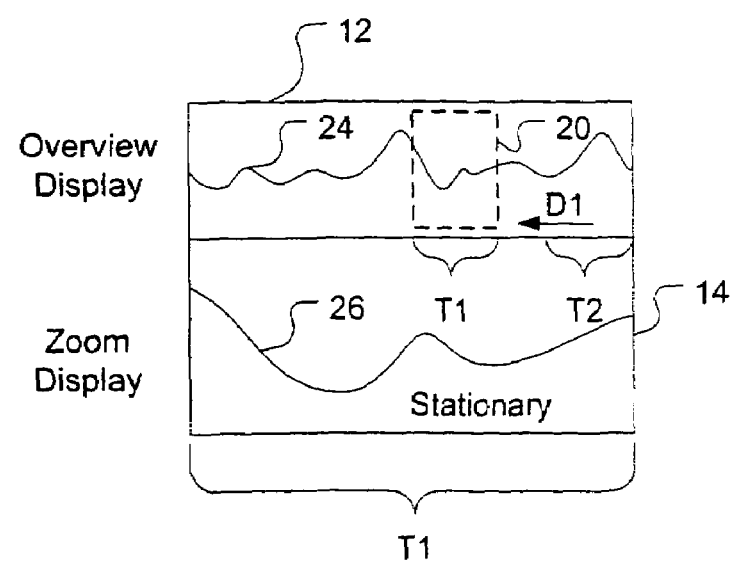

FIGS. 2-4 are diagrams illustrating scrolling of a digitized waveform according to an embodiment of the invention. FIG. 2 and FIG. 3 in conjunction illustrate a scrolling digitized waveform where the zoom display 14 is locked to an edge of the overview display 12. Direction D1 indicates the direction of scrolling of the digitized waveform 24. Time span T1 indicates a time span of the digitized waveform 24. The portion of the digitized waveform 26 over time span T1 is displayed in the zoom display 14.

As time passes, new samples of the digitized waveform 24 appear in both the overview display 12 and the zoom display 14. As a result, the data within time span T1 has scrolled across the overview display 12. FIG. 3 illustrates the display after some time has passed. Since the zoom display 14 was not locked to the portion of the waveform within that time span, FIG. 3 illustrates a new time span T2 displayed in both the overview display 12 and the zoom display 14.

However, if a track signal is received when the apparatus 10 displays time span T1 as in FIG. 2, when the time span T2 appears, the apparatus 10 may appear as in FIG. 4. Since the track signal was received when time span T1 appeared within the zoom display 14, the zoom display 14 will track that portion of the digitized waveform. Even after some time passes, particularly the time until time span T2 appears in the overview display 12, the zoom display 14 will still display the portion of the digitized waveform over time span T1. In addition, the zoom indicator 20 tracked the portion of the digitized waveform over time span T1, indicating that the time span T1 was the portion of the digitized waveform displayed in the zoom display 14. Thus, a user has had at least the time from the appearance of time span T1 to the appearance of time span T2 to examine the portion of the digitized waveform 26. Without such tracking, the user would have had, at the most, the width of time span T1 to observe any events on the digitized waveform.

Figure 5:
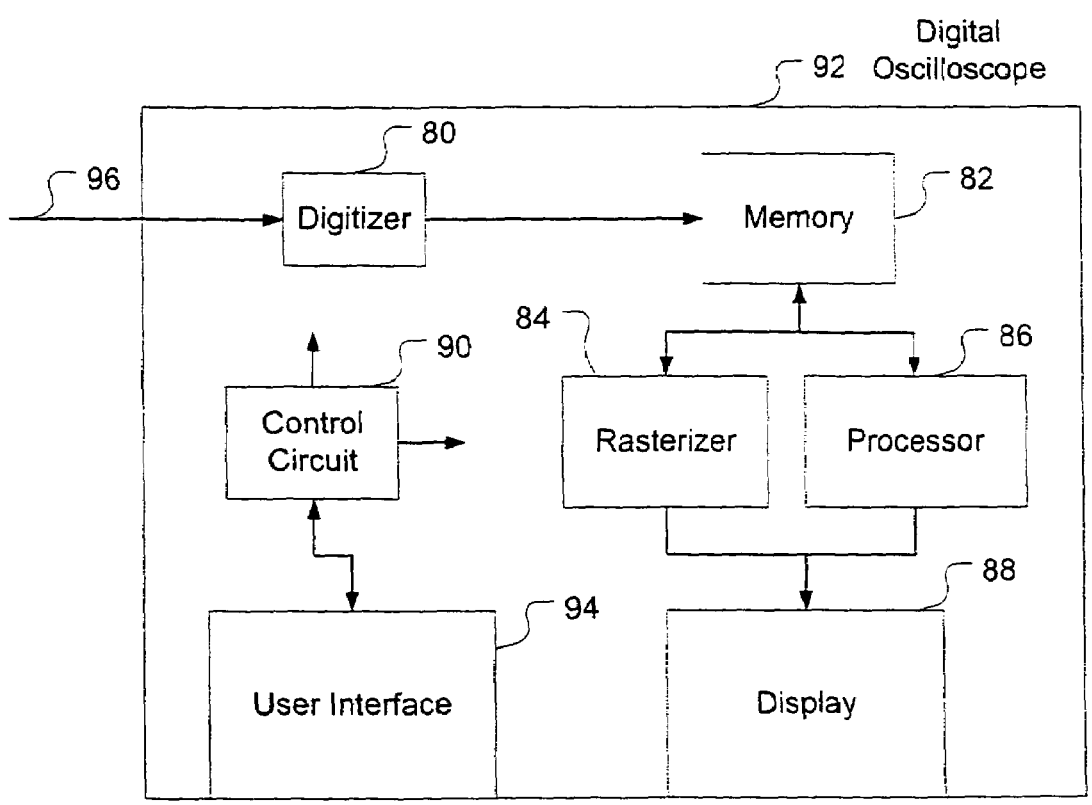
FIG. 5 is a block diagram of a digital oscilloscope according to an embodiment of the invention.

FIG. 5 is a diagram of a digital oscilloscope according to an embodiment of the invention. The digital oscilloscope 92 includes a digitizer 80, a memory 82, a rasterizer 84, a processor 86, a display 88, a user interface 94, and a control circuit 90. The digital oscilloscope is an example of an apparatus 10 as described above. The digitizer 80 digitizes an input signal 96 into a digitized waveform. The digitized waveform is stored in the memory 82. Both the processor 86 and the rasterizer 84 may access the memory 82 and display images on the display 88. The control circuit 90 may control the operation of the digital oscilloscope 92 in response to the user interface 94.

The display 88 may include the overview display 12 and the zoom display 14 described above. The control unit 16 described above may be a portion of both the control circuit 90 and the user interface 94. In addition, an event detector 22 (described below) may be a part of the control circuitry and the processor 86.

Although particular components and connections have been illustrated in FIG. 5, one skilled in the art will understand that the digital oscilloscope 92 is merely an example of an apparatus 10. Various changes may be made to the digital oscilloscope 92 yet still be considered an apparatus 10. For example, the digital oscilloscope 92 may include only a processor 86 and not a rasterizer 84, where the processor performs the rasterization of waveforms for display on the display 88.

Figure 6:
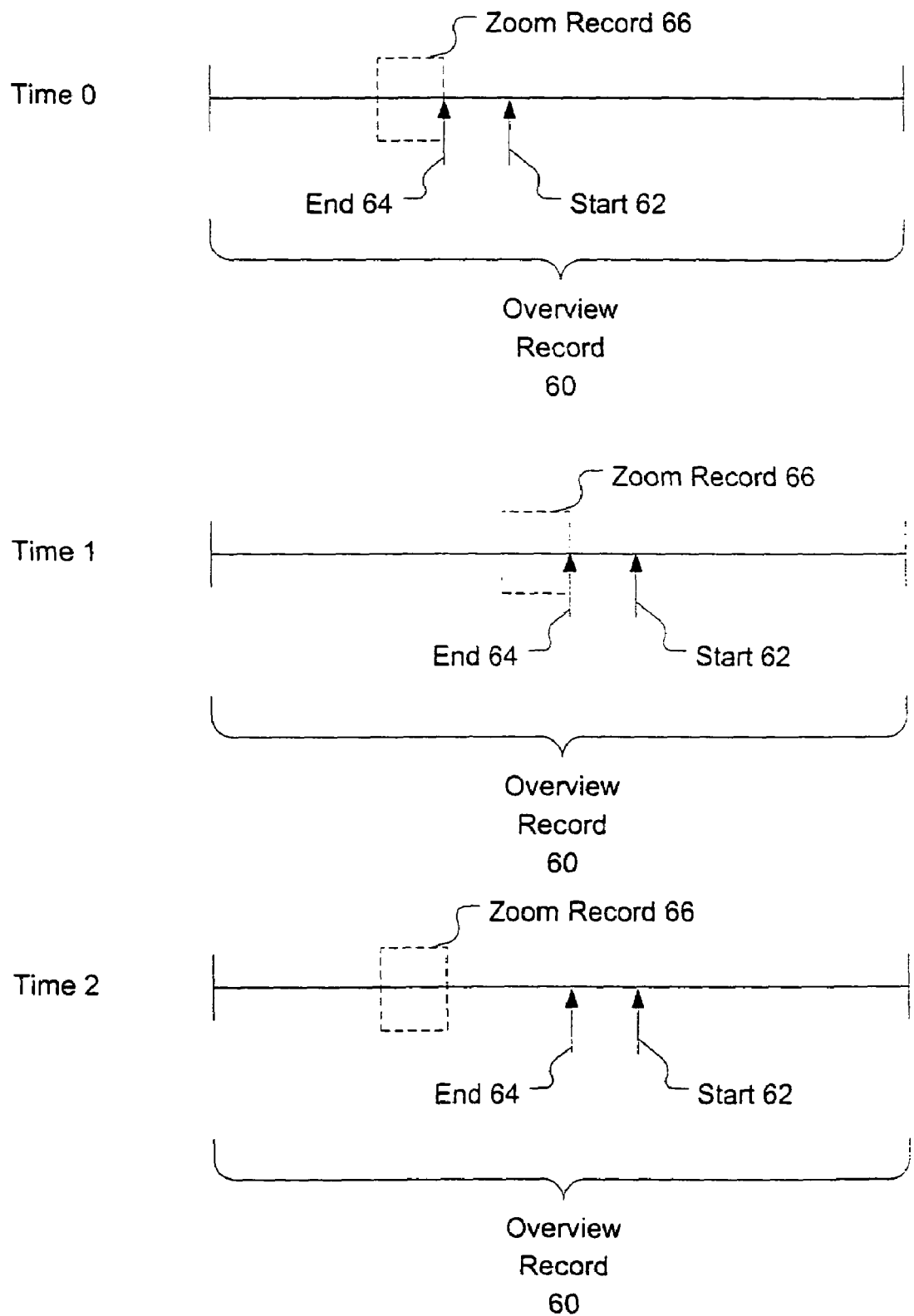
FIG. 6 is a diagram of memory usage within an apparatus for displaying a digitized waveform according to an embodiment of the invention.

FIG. 6 is a diagram of memory usage within an apparatus for displaying a digitized waveform according to an embodiment of the invention. An overview record 60 may be a portion of memory. As illustrated in FIG. 6, the overview record 60 is a circular buffer having a start 62 and an end 64. In roll mode, for example, as new data is acquired, it is added to the end 64. Old data is removed from the start 62. In this example, the start 62 and the end 64 move to point to new memory locations. As a result, new samples overwrite older, expired samples.

Time 0 illustrates a state of the overview record 60 at an arbitrary point in time. A zoom record 66 is positioned in the overview record 60 at the end 64 to indicate the most recently acquired samples. Similar to in FIG. 2, the zoom record 66 moves along with the end 64 as new samples are acquired, so that the digitized waveform stored in the overview record 60 appears to be scrolling across the zoom display 14.

Time 1 illustrates the state of the overview record 60 without a track signal. Both the start 62 and the end 64 have moved, with the zoom record 66 following the end 64. Thus, new samples added to the end 64 are now displayed in the zoom display 14 according to the samples in the zoom record 66.

Time 2 illustrates the state of the overview record 60 after receiving a track signal. Even though the start 62 and the end 64 have moved as described with reference to Time 1, the zoom record 66 has remained stationary so that the samples displayed on the zoom display 14 will appear to track those samples.

Although a circular buffer is used to describe storage of the overview record 60, other data structures may be used that provide similar access to the overview record 60. In addition, although movement of the start 62 and end 64 has been described, such movement may be relative, depending on the data structure used to store the overview record 60. For example, the start 62 and end 64 may point to fixed memory locations where the data of the overview record is moved in its entirety for each new sample.

Referring again to FIG. 1, the control unit 16 may also include an adjustment control to change the portion of the digitized waveform displayed in the zoom display 14. The adjustment control may include a pan control, a position control, a scale control, and the like to adjust the zoom display 14. Furthermore, the adjustment control may include any number of different or similar controls. For example, one adjustment control may include a pan control and a scale control. Another adjustment control may include a coarse position-control for large position changes, and a fine position control for precise changes. Any combination or variety of controls is possible.

A pan control may be implemented with fast forward and reverse buttons. In response to the forward and reverse buttons, the portion of the digitized waveform displayed in the zoom display 14 may move relative to the digitized waveform. Thus, the portion of the digitized waveform displayed in the zoom display 14 would no longer be locked to a particular set of samples, nor need it be locked to a position relative to the overview display 12. For example, if a user presses the fast forward button, the portion displayed in the zoom display 14 may begin to move towards more recent digitized waveform samples. As a result, the digitized waveform in the zoom display 14 would appear to be moving, albeit at a different rate.

The portion in the zoom display 14 may be moving at a rate that is the same or different from the digitized waveform in the overview display 12. For example, after pressing the fast forward button, the zoom display 14 may display the digitized waveform moving at the same rate as the overview display. Thus, the zoom display 16 would display the portion of the digitized waveform moving in time just as if the zoom display 14 was not tracking the digitized waveform.

Alternatively, the portion may move relative to the digitized waveform at a rate different that in the overview display 12. For example, the rate may be smaller as a result of a user pressing a fast forward button after the zoom display 14 was tracking a portion of the digitized waveform. Thus, the digitized waveform displayed in the zoom display 14 would appear to be moving towards new samples, but not as fast as in the overview display 14. In effect, the zoom display 14 would display the digitized waveform similarly to being locked to a position of the overview display 12, yet the user would have control over the rate at which the digitized waveform moves through the overview display. It should be noted that this varying of the rate of digitized waveform moving through the zoom display 14 may be accomplished without either changing or pausing the acquisition rate of the apparatus 10. Thus, the probability of losing data from reducing the acquisition rate or pausing the acquisition is eliminated.

Furthermore, the rate may be in an opposite direction as compared with the overview display 12. Such an opposite direction may result from the user pressing a reverse button or other similar adjustment control.

In addition, the rate at which the digitized waveform is displayed in the zoom display 14 may be greater than the rate at which the digitized waveform is displayed in the overview display 12. For example, the user may see an interesting event in the zoom display 14. The user may engage the track function to track the digitized waveform where the user saw the interesting event. In the mean time, more data is being acquired and displayed on the overview display. As a result of the tracking, the relative position of the zoom display 14 is moving relative to the most recently acquired sample. After the user examines the interesting event, the user may disengage the tracking of the digitized waveform, allowing the digitized waveform to move in the zoom display 14 at the same rate as in the overview display 12. However, the user would be behind the most recently acquired samples by the amount of time that elapsed between tracking the digitized waveform and disengaging the tracking. To save time, the zoom display 14 may display the digitized waveform moving at a faster rate than in the overview display 12. As a result, the user may "catch up" to the most recently acquired samples, yet still examine the digitized waveform that was acquired while the user was examining the interesting event. Thus, through various combinations of adjustment controls, the user may move the zoom display 14 arbitrarily within the data displayed in the overview display 12.

A user's reaction time may not be sufficient to catch an interesting event within the zoom display 14. With the conventional roll mode interface, if the user misses the interesting event, the user may only view the interesting event on the overview display with reduced resolution. However, by engaging the tracking of the digitized waveform, even after the interesting event has passed out of the zoom display 14, the user may stop the movement of the digitized waveform in the zoom display 14 and pan to earlier samples to investigate the interesting event.

Furthermore, the control over the portion displayed in the zoom display 14 may be implemented with a jog wheel. A jog wheel is a control that allows for manipulation of relative position and/or rates. The jog wheel may be implemented as a knob which the user may turn. If the user turns the knob clockwise, the zoom display 14 may change as if the user pressed a fast forward button. The rate of the change may be proportional to the angular deflection of the knob from a center position. Similarly, the user may rotate the knob counter-clockwise to change the zoom display 14 as if the user pressed a rewind button.

Although buttons and jog wheels have been described, any control that may indicate a change in relative motion or position of the digitized waveform in the zoom display 14 may be used. For example, a slider with zero relative motion in the center, and maximum relative motion at the ends may be used.

Furthermore, the control may function continuously or in discrete amounts. For example, a knob may have detents at −1, −0.5, 0, 0.5, and 1. Thus, the user may choose any of the five rates of relative motion. Alternatively, the knob may turn continuously between −1 and 1, allowing the user to select rates anywhere between the limits. In addition, a combination of the above controls may be used. Thus, a continuous control may have detents at desired locations, giving the user both continuous control for arbitrary rates and known rates associated with the detents.

In addition, the control unit 16 may include a horizontal position knob. By turning the knob, the relative position of the portion of the digitized waveform in the zoom display 14 may be adjusted. For example, if the zoom display 14 is tracking a portion of the digitized waveform, the horizontal position knob may adjust the position of the portion displayed relative to the overall digitized waveform.

Furthermore, the control unit 16 may include a horizontal scale control. The zoom display 14 may have a particular zoom factor. By changing the horizontal scale control, the zoom factor of the zoom display 14 may be changed, thus enlarging or reducing the portion of the digitized waveform displayed in the zoom display 14.

As described above, adjustment controls may allow the zoom display 14 to display the digitized waveform moving at a particular rate. The change in the rate due to the use of the control may be controllable by the user. As described above, a control such as the jog wheel may have continuous control of the rate. However, discrete fast forward and reverse buttons may not. As a result, an additional control may set the amount at which one input on the control changes the rate. For example, the angular offset of a knob may indicate the absolute value of the change in the rate. Thus, when a user presses the fast forward or rewind button, the zoom display 14 would change at the rate set by the knob.

Once the user has engaged a rate of change of the zoom display 14 after tracking a portion of the digitized waveform, the user may once again activate an input that causes the zoom display 14 to track the currently displayed portion of the digitized waveform. Alternatively, adjustments to the rate at which the zoom window 14 is displaying the digitized waveform may adjust the rate to zero. Thus, the digitized waveform would appear to be stationary within the zoom display 14, just as if the zoom display 14 was tracking a portion of the digitized waveform.

As a result of the adjustment controls that automatically change the rate at which the digitized waveform is displayed in the zoom display 14, the user may move the zoom display 14 relative to the digitized waveform without constantly turning a horizontal position knob or other similar control.

The apparatus may include an event detector 22. The event detector 22 is configured to detect a defined event on the digitized waveform. The defined event may be any number of events associated with the digitized waveform. Such events include aspects of the digitized waveform that may be measured or otherwise extracted from the digitized waveform. For example, a defined event may include a point in time that the digitized waveform crosses a particular threshold. In addition, a defined event may include thresholds to determine if an overshoot on the digitized waveform exceeds a tolerance, or if a pulse width is smaller than a minimum pulse width. Any characteristic of the digitized waveform may be used in the detection of a defined event.

Defined as used in defined event refers to an event, the characteristics of which have been determined. The characteristics of the event may be defined at any point in time. For example, some characteristics of defined events, such as the digitized waveform crossing a 50% threshold, may be defined at the time the apparatus 10 is manufactured. In addition, other defined events, such as an amount of overshoot may be defined while a digitized waveform is currently being acquired.

Furthermore, such definition of the event need not occur before an event actually occurs. For example, as a digitized waveform is displayed in roll mode, samples of the digitized waveform from earlier periods of time may remain in memory to be displayed in the overview display 12. Thus, a defined event that occurs in the past may still be detected on the digitized waveform even though the definition of the event occurs after the occurrence of the detected event.

As described above, the defined events may be established at any point in time. Furthermore, the defined events may be established in numerous ways. As described above, an event such as a 50% crossing may be defined during manufacturing. Alternatively, a user may define an event manually though a user interface of the apparatus 10. Furthermore, defined events may be defined outside of the apparatus 10 and later communicated to the apparatus. For example, new defined events may be included as part of a firmware or software update for the apparatus 10.

The user may select a defined event of interest. The control unit 16 may generate the track signal in response to a detected defined event. Thus, while a user is observing the digitized waveform scroll by in the zoom display window, the event detector 22 detects a defined event. The control unit 16 generates the track signal in response, causing the zoom display 14 to track the portion of the digitized waveform displayed in the zoom display 14. Thus, a user need not intently observe the zoom display 16 poised to give an input when an interesting event appears. The apparatus 10 may automatically detect the defined event and track the defined event so that the user may perform a test without such concentration or effort.

A particular defined event may occur multiple times over the digitized waveform displayed in the overview display 12. The event detector 22 may record times of these defined events. In addition, the control unit 16 may include a recorded event interface configured to select a recorded defined event. Thus, the user may select one or more of the detected defined events through the recorded event interface of the control unit 16.

The zoom display 14 may display a portion of the digitized waveform associated with a selected recorded defined event. Thus, through the selection of a defined event, the user may observe the digitized waveform surrounding that defined event in the zoom display 14. In addition, the user may move from one defined event to another through the recorded event interface with the zoom display 14 adjusting accordingly.

Figure 7:
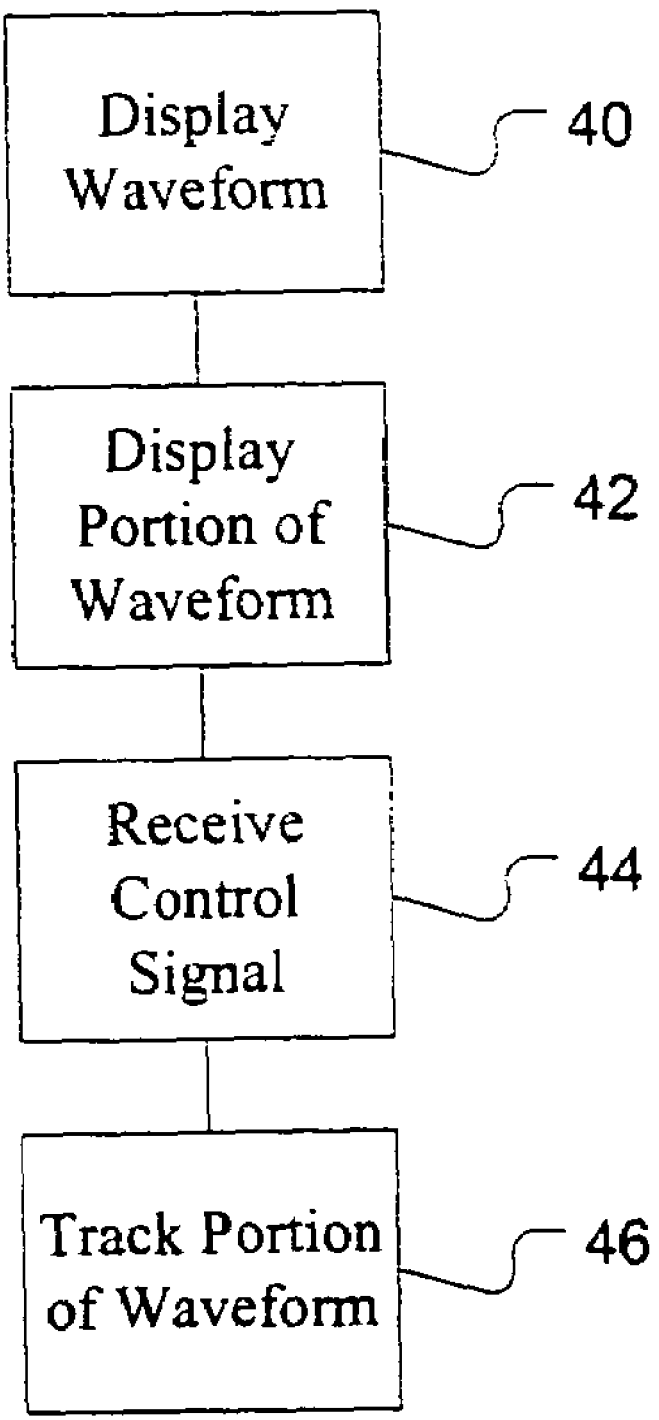
FIG. 7 is a flowchart of a method of displaying a digitized waveform on a test and measurement instrument according to an embodiment of the invention.

FIG. 7 is a flowchart of a method of displaying a digitized waveform on a test and measurement instrument according to an embodiment of the invention. The method includes displaying a digitized waveform 40 scrolling over time. A portion of the digitized waveform is displayed in 42 scrolling over time in a zoom display such that new samples of the digitized waveform appear in the zoom display at the same rate as the new samples of the digitized waveform appear in the displayed digitized waveform. The method also includes receiving a control signal 44, and displaying the portion of the digitized waveform 46 displayed in the zoom display at substantially the same time as receiving the control signal 44 while the new samples of the digitized waveform appear in the displayed digitized waveform.

As described above the digitized waveform may be displayed in roll mode. Thus new samples are acquired, added to the displayed digitized waveform, and old samples are removed. Thus, the display of the digitized waveform includes newly acquired samples and a set of previously acquired samples. As a result, the digitized waveform appears to be scrolling over time. A portion of the digitized waveform is displayed in the zoom display. The portion is also scrolling over time such that new samples of the displayed digitized waveform are also displayed in the zoom display. Since new samples of the digitized waveform are displayed at the same rate as new samples are displayed in the zoom display, the portion of the digitized waveform displayed in the zoom display may appear to be moving faster than the display of the digitized waveform.

A control signal is received in 44. The control signal may come from a variety of sources. For example, as described above, the control signal may be a result of a user input to control unit 16. The input from the user is received, and the control signal is generated in response to the input.

In response to the control signal, the portion of the digitized waveform displayed in the zoom display tracks the portion that is or was displayed at substantially the same time as when the control signal was received in 44.

One skilled in the art will understand that there may be some time offset between receiving the control signal and the change of the zoom display. For example, once a control signal is received, the instruction to track the portion of digitized waveform displayed in the zoom display may take time to propagate to the control of the zoom display. Thus, during that propagation time period, the zoom display may change, displaying new samples. As a result, the portion of the digitized waveform displayed in response to the control signal may be offset in time from the portion displayed at the exact time the control signal was received.

Figure 8:
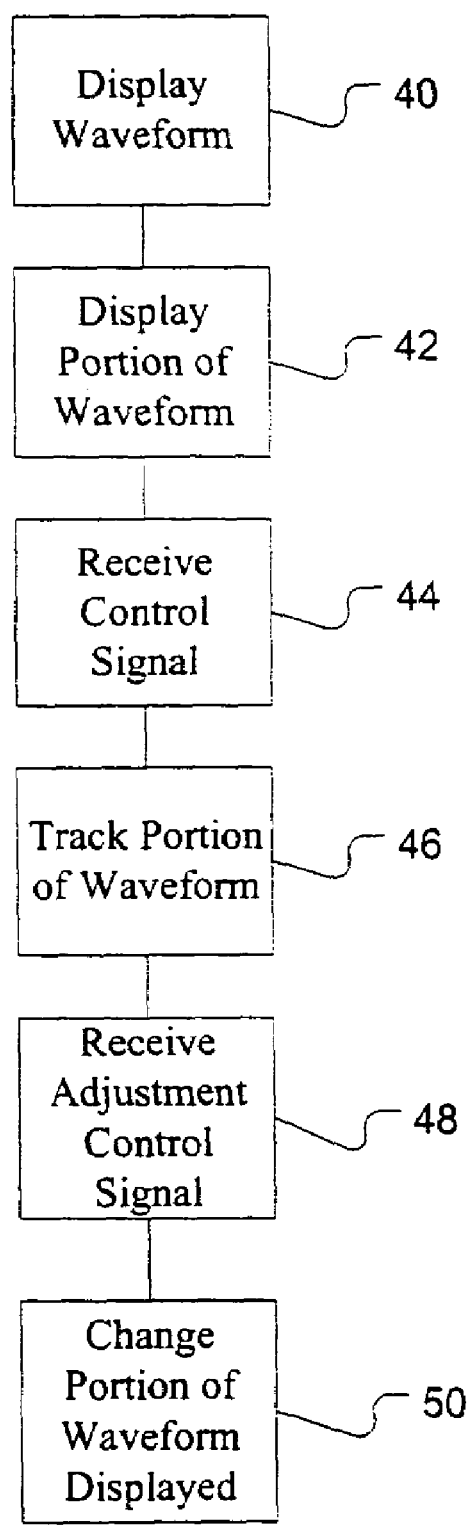
FIG. 8 is a flowchart illustrating changing a portion of a waveform displayed in a method of displaying a digitized waveform on a test and measurement instrument according to another embodiment of the invention.

FIG. 8 is a flowchart illustrating changing a portion of a digitized waveform displayed in a method of displaying a digitized waveform on a test and measurement instrument according to another embodiment of the invention. The method may include receiving an adjustment control signal in 48. The portion of the digitized waveform in the zoom display may be changed in 50 in response to the adjustment control signal. As described above, the adjustment control signal may include signals generated by a variety of controls such as panning of the zoom display, jumping to a predefined event, adjusting the speed at which the digitized waveform moves through the zoom display, and the like.

Figure 9:
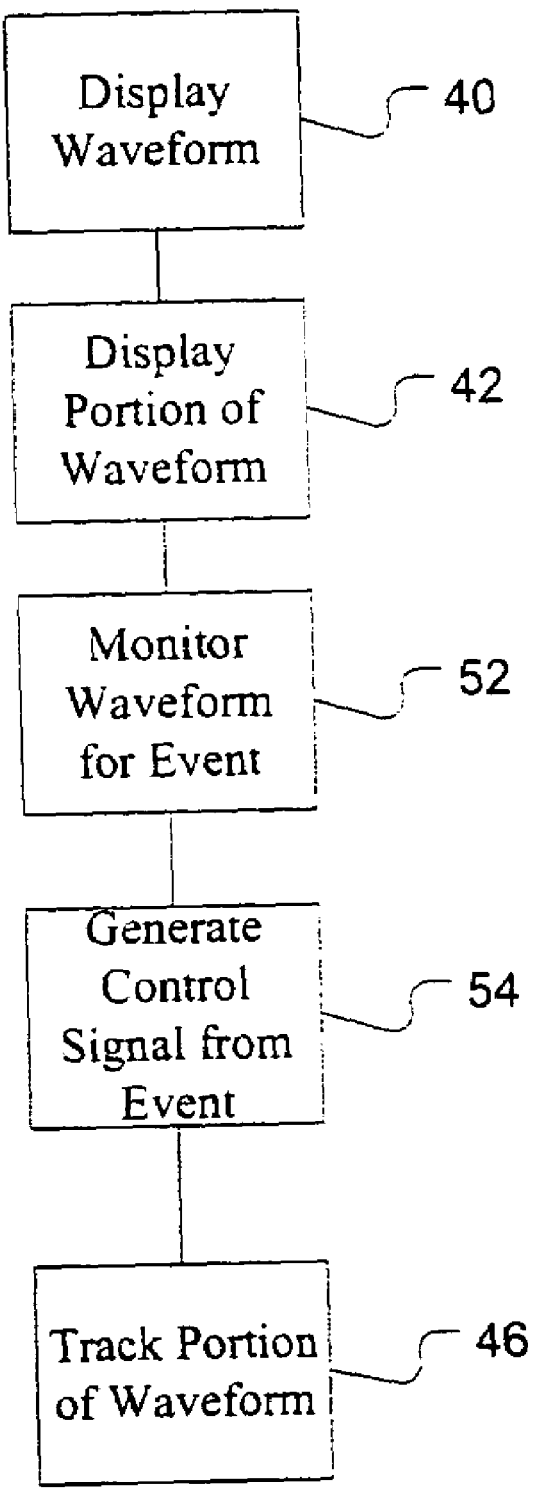
FIG. 9 is a flowchart illustrating monitoring a waveform for an event in a method of displaying a digitized waveform on a test and measurement instrument according to another embodiment of the invention.

FIG. 9 is a flowchart illustrating monitoring a digitized waveform for an event in a method of displaying a digitized waveform on a test and measurement instrument according to another embodiment of the invention. The method may include monitoring the digitized waveform in 52 for a defined event, and generating the control signal in 54 in response to finding the defined event on the digitized waveform. As described above, defined events may be detected on the digitized waveform. To detect the defined events, the digitized waveform is monitored in 52 for the defined events. When a defined event is found, the control signal is generated in 54.

Furthermore, any defined events on the digitized waveform may be marked. As described above, defined events may appear on the digitized waveform. The defined events may be marked. Using these markings, the zoom display may be changed to display portions of the digitized waveform around a particular defined event. The change may be in response to a variety of signals, including a user input, the detection of another defined event, and the like. For example, the user may select from among the defined events and the zoom display would change accordingly to display the selected defined event.

If the zoom display is displaying a portion of the digitized waveform where no samples are being added or removed from the display, eventually, as the digitized waveform scrolls across the display, the portion of the digitized waveform in the zoom display as represented by a portion of the digitized waveform in the overview display, will eventually reach one edge of the display. At this point, the zoom display may change from displaying a fixed portion of the digitized waveform into displaying new samples of the digitized waveform. However, with respect to the zoom display, the new samples are no longer the most recently acquired samples of the overview display. In contrast, the new samples are the next samples from later time periods relative to the portion currently displayed in the zoom display.

Alternatively, when the zoom display reaches an edge of the display, new samples may be displayed in the zoom display at a rate faster than in the overview display. Thus, the zoom display will appear to be fast-forwarding such that the zoom display will eventually be displaying the most recent samples. Furthermore, when the zoom display reaches the opposite edge of the overview display, the rate at which new samples are added to the zoom display may again change so that samples are added to both the zoom display and the overview display at the same rate.

In another embodiment, an apparatus for displaying a digitized waveform includes means for displaying a digitized waveform scrolling over time, means for displaying a portion of the digitized waveform, and means for selecting a time span of the digitized waveform. The means for displaying the portion of the digitized waveform is configured to display the portion of the digitized waveform over the selected time span while the means for displaying the digitized waveform is displaying the digitized waveform scrolling over time.

The means for selecting the time span of the digitized waveform may include a user input interface. As described above, many interfaces are available for indicating that a user wants to track a portion of the digitized waveform. Buttons, network interfaces, automatic and manual event indicators, and others may be used as the means for selecting the time span of the digitized waveform. In the above described examples, a portion of the digitized waveform is tracked while the overview digitized waveform is scrolling across a display. Thus, a time span of the digitized waveform, corresponding to the portion of the digitized waveform is selected.

The apparatus may include means for identifying an event on the digitized waveform. As described above, numerous events may be identified on the digitized waveform. Furthermore, the means for selecting the time span of the digitized waveform may select the time span in response to an identified event. Thus, the means for identifying the event may include any of the above described configuration for identifying an event.

As described above, the apparatus may include continuously acquiring data, as in the roll mode, for example. Thus, the apparatus may include means for continuously acquiring the digitized waveform. The newly acquired samples may be added to the samples displayed by the means for displaying the digitized waveform and the means for displaying the portion of the digitized waveform as desired.

In addition, as described above, the apparatus may include using stored data as the digitized waveform, as in the playback mode, for example. Thus, the apparatus may include means for providing a stored digitized waveform as the digitized waveform scrolling over time. The samples may be read from memory or other storage and used to update the digitized waveform displays.

By using the above described apparatus or method, the capability of examining digitized waveforms is improved. The user is able to better analyze the incoming data without having to stop the acquisition. In addition, the user is able to examine fine details of the digitized waveform for longer periods of time. Thus, there is a great deal of flexibility in examining the overall digitized waveform being acquired. In particular, in roll mode when long record lengths are available, detailed portions of the acquired digitized waveform may be inspected without pausing the acquisition.

Although particular embodiments have been described, it will be appreciated that the scope of the claims is not limited to those embodiments. Variations and modifications may be made without departing from the scope of the invention as set forth in the following claims.

The invention claimed is:

1. An oscilloscope for displaying a digitized waveform, comprising:
a display screen for displaying an overview display of a digitized waveform horizontally scrolling across the overview display in accordance with a roll mode of operation;
said display screen concurrently displaying a zoom display of a portion of the digitized waveform; and
a control unit configured to cause the portion of the digitized waveform displayed in the zoom display to track the displayed portion of the digitized waveform in response to a track signal, such that the waveform portion displayed in said zoom display appears stationary;
wherein the control unit further comprises a user interface configured to generate the track signal in response to a user input.

2. The oscilloscope of claim 1, wherein the overview display further comprises a zoom indicator configured to indicate the portion of the digitized waveform displayed in the zoom display.

3. The oscilloscope of claim 1, wherein the control unit further comprises an adjustment control configured to change the portion of the digitized waveform displayed in the zoom display.

4. The oscilloscope of claim 1, further comprising an event detector configured to detect a defined event on the digitized waveform.

5. The oscilloscope of claim 4, wherein the control unit is further configured to generate the track signal in response to a detected defined event.

6. The oscilloscope of claim 4, wherein:
the event detector is further configured to record times of defined events;
the control unit further comprises a recorded event interface configured to select a recorded defined event; and
the zoom display is configured to display a portion of the digitized waveform associated with a selected recorded defined event.

7. An oscilloscope for displaying a digitized waveform, comprising:
means for displaying the digitized waveform in a horizontal scrolling operation over time;
means for concurrently displaying a magnified portion of the digitized waveform;
means for selecting a time span of the magnified portion of the waveform; and
means for modifying a length of the magnified portion of the waveform in accordance with said selected time span;
wherein the means for displaying the magnified portion of the digitized waveform is configured to display the portion of the digitized waveform over the selected time span when the means for displaying the digitized waveform is displaying the digitized waveform scrolling horizontally over time, such that the waveform portion displayed in said zoom display appears stationary;
wherein the control unit further comprises a user interface configured to generate the track signal in response to a user input.

8. The oscilloscope of claim 7, wherein the means for selecting the time span of the digitized waveform further comprises a user input interface.

9. The oscilloscope of claim 7, further comprising means for identifying an event on the digitized waveform, wherein the means for selecting a time span of the digitized waveform is configured to select a time span in response to an identified event.

10. The oscilloscope of claim 7, further comprising means for continuously acquiring the digitized waveform.

11. The oscilloscope of claim 7, further comprising means for providing a stored digitized waveform as the digitized waveform scrolling horizontally over time.

* * * * *